United States Patent [19]
Kitabayashi et al.

[11] Patent Number: 4,647,813
[45] Date of Patent: Mar. 3, 1987

[54] ELECTROLUMINESCENT DEVICE HAVING AN ADDITIONAL SELENIUM LAYER

[75] Inventors: Motoi Kitabayashi, Nagano; Takuo Hayashi, Ina; Norihiko Ozawa, Ina; Yukihiro Hirasawa, Ina; Naotoshi Miyazawa, Nagano, all of Japan

[73] Assignees: Koa Corporation, Nagano; Kiyoshi Takahashi; Makoto Konagai, both of Tokyo, all of Japan

[21] Appl. No.: 676,506

[22] Filed: Nov. 29, 1984

[30] Foreign Application Priority Data

Dec. 8, 1983 [JP] Japan .................................. 58-231792

[51] Int. Cl.⁴ .......................................... H05B 33/22
[52] U.S. Cl. .................................... 313/509; 313/503; 313/506
[58] Field of Search .............. 313/506, 499, 504, 503, 313/509, 505

[56] References Cited

U.S. PATENT DOCUMENTS 2,818,531 12/1957 Peek, Jr. ........................ 313/506 X
3,708,708 1/1973 Soxman ......................... 313/503 X
4,543,511 9/1985 Ellis et al. ...................... 313/505 X Primary Examiner—Palmer C. DeMeo
Assistant Examiner—Sandra L. O'Shea
Attorney, Agent, or Firm—James E. Nilles

[57] ABSTRACT

An electroluminescent device wherein a light-emitting layer is formed between electrode layers, and a selenium layer is formed between the light-emitting layer and at least one of the electrode layers. Each of the crystals in the selenium layer grows in a columnar shape in the direction extending at right angles to the light-emitting layer.

2 Claims, 4 Drawing Figures

ELECTROLUMINESCENT DEVICE HAVING AN ADDITIONAL SELENIUM LAYER

BACKGROUND OF THE INVENTION

1. Field of the Invention

This invention relates to an electroluminescent device (EL device), and more particularly to an electroluminescent device the light-emitting layer of which has improved voltage resistance and improved current resistance.

2. Description of the Prior Art

An electroluminescent device consists of a basic structure composed of electrodes and a light-emitting layer inserted between the electrodes and formed by adding an active material which constitutes the light-emitting nuclei, such as Mn, Tb and Sm, to a semiconductor, for example, ZnSe and ZnS. In order to generate the light in the EL device, an electric field or an electric current is applied to the light-emitting layer to strike the electrons against the light-emitting nuclei. While a light-emitting layer is formed, defective portions having a low voltage resistance and a low current resistance, such as pinholes and crystal grain boundary occur therein; it is difficult to form a light-emitting layer having no defects with respect to the total surface area thereof. Due to the low voltage resistance and low current resistance which are ascribed to these defects, it is difficult to use the EL device practically with such a basic structure alone. There is an AC EL device adapted to emit light when an electric field is applied thereto, in which layers of an insulating material are formed on both sides of a light-emitting layer to secure a high voltage resistance thereof and thereby solve the above-mentioned problems. However, in a DC EL device adapted to emit light when an electric current is injected thereinto, it is impossible to insert layers of an insulating material between the electrodes. Accordingly, it is difficult in a DC EL device to improve the voltage resistance thereof. Furthermore, a DC EL device has another problem in that it is burnt due to the current concentration caused by the heterogeneity of and defects in the light-emitting layer thereof. Therefore, a DC EL device has not yet been put to practical use.

SUMMARY OF THE INVENTION

An object of the present invention is to obtain in view of the above-mentioned problems an electroluminescent device having a light-emitting layer between the electrodes, characterized in that a selenium layer is formed between the light-emitting layer and at least one of the electrodes, the non-conductive selenium being formed by utilizing the self-curing capability of the selenium between the electrode and the portions of the light-emitting layer which have a low voltage resistance due to the pinholes and crystal grain boundary therein, to improve the voltage resistance of the mentioned portions of the light-emitting layer, the occurrence of the current concentration in the low-resistance portions of the light-emitting layer due to the pinholes and crystal grain boundary therein being prevented by utilizing the fact that the crystals in the selenium layer formed between the light-emitting layer and the electrode have a non-isotropic resistance in a certain crystallization direction, to thereby keep the burning of the EL device from occurring.

The electroluminescent device according to the present invention has a light-emitting layer between the electrodes, and a selenium layer formed between the light-emitting layer and at least one of the electrodes, the portions of the light-emitting layer which have a low voltage resistance being voltage-treated to form non-conductive portions between the light-emitting layer and the electrode and thereby improve the voltage resistance of the mentioned portions of the light-emitting layer, the crystals in the selenium layer formed between the light-emitting layer and the electrode growing in a columnar shape in the direction which is at right angles to the light-emitting layer (in the direction in which the light-emitting layer and the electrode are joined together), so that the resistance of the selenium crystals is low in the direction across the light-emitting layer at right angles thereto and high in the direction parallel thereto, thus, the portions of the light-emitting layer which are subject to the current concentration being protected against such a troublesome phenomenon by the selenium layer inserted in the above-mentioned manner.

The light-emitting layer in the present invention is a layer formed by adding as an active material a metal which constitutes the light-emitting nuclei, such as Mn, Tb and Sm, to a semiconductor, for example, ZnSe and ZnS. The selenium layer in the present invention consists of a layer of selenium in the form of polycrystal, a layer of an alloy of Cd or Bi or other metals such as Te containing not less than 70% selenium, or a layer of selenium in the form of polycrystal containing not less than 70% of selenium, a part of which is substituted by another element, such as an alkali metal and halogen. When the selenium content is not more than 70%, the self-curing capability of the selenium decreases. One electrode consists of a Sn-doped $In_2O_3$(ITO) transparent film, and the other an Al film or a Cd film or other metal film.

The selenium layer is formed between the electrode which is on the opposite side of the transparent electrode and the light-emitting layer. If the selenium layer has permeability, i.e. if the thickness of the selenium layer is small enough to permit the light to pass therethrough, the selenium layer may be formed on both sides of the light-emitting layer, or only between the ITO electrode and the light-emitting layer.

A buffer layer consisting of Ga-doped ZnSe may also be formed between the ITO electrode and the light-emitting layer to put the crystallinity in order and form the light-emitting layer in a condition of optimum crystallinity.

The above and other objects as well as advantageous features of the invention will become apparent from the following description of the preferred embodiments taken in conjunction with the accompanying drawings.

DESCRIPTION OF THE PREFERRED EMBODIMENTS

EXAMPLE 1

Figure 1:
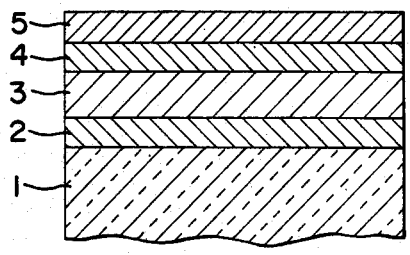
FIGS. 1–4 are enlarged sectional views of different embodiments of the EL device according to the present invention.

As shown in FIG. 1, a transparent ITO electrode 2 is formed to the thickness of 0.2 μm on a glass substrate 1 by a sputtering method, and the resultant product is set in a vacuum evaporator. The substrate 1 is then heated to 300° C. to carry out the vacuum evaporation of a light-emitting layer 3. The light-emitting layer 3 is formed by evaporating Zn, Se and Mn from different crucibles to make a film of ZnSe:Mn (0.5 wt%) to the thickness of 0.3 μm on the electrode 2. The substrate 1 is then cooled to normal temperature, and Se is vacuum-evaporated to the thickness of 0.2 μm on the light-emitting layer 3. The Se film is then heat-treated at 100°-180° C. for 15-120 min. to turn the amorphous selenium into polycrystalline selenium, so that a selenium layer 4 is formed. An Al electrode 5 is then formed to the thickness of 0.2 μm on the selenium layer 4 by the vacuum evaporation.

When a 10 V DC voltage is applied between the electrodes 2, 5 of the EL device thus obtained, the defective portions of the light-emitting layer 3, which have a low voltage resistance due to the pinholes and crystal grain boundary occurring therein, becomes highly resistant to a voltage since a part of the selenium layer 4 becomes non-conductive due to its self-curing capability.

The function of the selenium layer 4 in the above embodiment will now be described.

When a DC voltage is applied between the electrodes 2, 5, the defective portions of the light-emitting layer 3, which occur in the pinholes and among the crystal grain boundary, and which have a low voltage resistance, undergo dielectric breakdown. As a result, the selenium layer 4 interposed between these defective portions and electrode 5 and having a crystalline structure is melted to lose the crystalline structure and become a non-conductive body interposed between the defective portions of the light-emitting layer 3 and Al electrode 5, so that the insulating characteristics of the defective portions are improved. Namely, the voltage resistance of the defective portions of the light-emitting layer 3 is improved owing to the self-curing capability of the selenium. The selenium layer 4 provided between the Al electrode 5 and light-emitting layer 3 has non-isotropic resistance in a certain crystallization direction thereof. Namely, a selenium crystal grows easily in the direction (direction in which the light-emitting layer 3 and electrode 5 are joined together) which extend at right angles to the light-emitting layer 3, and has a high resistance in the direction parallel to the light-emitting layer 3. Accordingly, an electric current does not flow in a concentrated manner to the low-resistance portions of the light-emitting layer 3 from the surrounding portions thereof. Therefore, the burning, which occurs due to the current concentration, of the light-emitting layer 3 can be prevented.

In order to test the voltage resistance and current resistance of the EL device obtained in the above-described Example 1, a direct current of up to 30 V and 10 mA/mm$^2$ was applied between the electrodes 2, 5. The results are shown in the following table.

| Test item | EL device having no selenium layer | EL device having selenium layer |
| --- | --- | --- |
| Voltage resistance | Dielectric breakdown occurred at a low voltage of not more than 10 V, and the device as a whole became inoperable. | Dielectric breakdown did not occur at a voltage of not more than 30 V. |
| Current resistance | The burning of the light-emitting layer started at around 1 mA/mm$^2$, and progressed gradually to become inoperable. | The light-emitting layer can be operated continuously at 10 mA/mm$^2$. |

It is understood from the above table that the EL device having the selenium layer 4 is superior with respect to the voltage resistance and current resistance.

EXAMPLE 2

Figure 2:
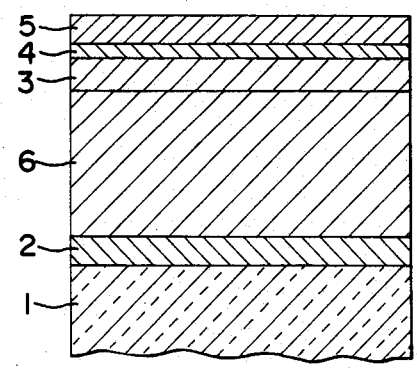

As shown in FIG. 2, a transparent ITO electrode 2 is formed to the thickness of 0.2 μm on a glass substrate 1 by a sputtering method. The resultant product is set in a vacuum evaporator, and ZnSe and Ga are evaporated on the electrode 2 by an electron beam evaporation at a substrate temperature of 300° C. to form a 1 μm thick, low-resistance Ga-doped ZnSe layer 6. A 0.2 μm thick ZnSe:Mn (0.5 wt%) light-emitting layer 3 is then formed on the layer 6 by evaporating ZnSe and Mn by an electron beam evaporation. The substrate temperature is then reduced to not more than 50° C., and a selenium layer 4 is formed to the thickness of 0.1 μm by the resistance heating evaporation. An Al electrode 5 is then formed to the thickness of 0.2 μm.

The product thus obtained was subjected to heat treatment in the atmospheric air at 150° C. for 30 minutes, and an AC voltage of 20 V was then applied between the electrodes 2, 5 to remove the defective portions of the light-emitting layer 3.

It was ascertained that the EL device thus obtained has improved voltage resistance and current resistance just as the EL device in Example 1.

EXAMPLE 3

Figure 3:
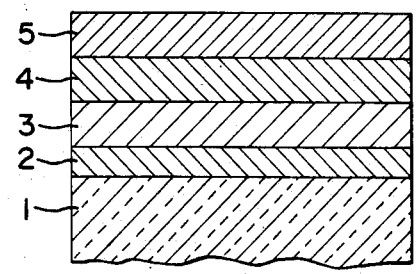

As shown in FIG. 3, a transparent ITO electrode 2 is formed to the thickness of 0.2 μm on a glass substrate 1 by an evaporation method. The resultant product is set in a vacuum evaporator, and ZnS:Mn is evaporated to the thickness of 0.3 μm by an electron beam evaporation to form a light-emitting layer 3 on the electrode 2. A selenium layer 4 is then formed to the thickness of 0.3 μm by the evaporation, and thereafter an electrode 5, which consists of a Cd layer, to the thickness of 0.3 μm.

The product thus obtained is heat-treated in the atmospheric air at 150° C. for 30 minutes.

In the EL device thus obtained, a rectifiable junction is formed in the interface between the selenium layer 4 and Cd electrode 5. However, if a voltage is applied in the forward direction when DC-operating the EL device, no problems arise. The voltage resistance and current resistance of the EL device in this Example are improved in the same manner as those of the EL device in Example 1.

EXAMPLE 4

Figure 4:
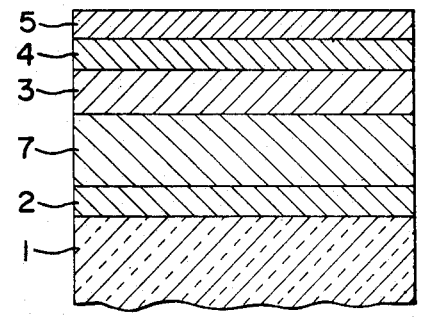

FIG. 4 illustrates an AC type EL device. This EL device was obtained by forming a transparent ITO electrode 2 of 0.2 μm in thickness on a glass substrate 1, a Y$_2$O$_3$ insulating layer 7 of 0.5 μm in thickness on the electrode 2, and thereafter a light-emitting layer 3, a selenium layer 4 and an Al electrode 5 in the mentioned order on the layer 7 in a vaccum evaporator by the same method as that used in Example 1.

In the electroluminescent device having a light-emitting layer between electrodes according to the present invention, a selenium layer is formed between the light-emitting layer and at least one of the electrodes. Therefore, the voltage resistance of the defective portions of the light-emitting layer, which are caused by the pinholes and crystal grain boundary occurring during the formation of the light-emitting layer, and which have a low voltage resistance, can be improved since the selenium layer positioned between the defective portions and the electrode is rendered non-conductive by its self-curing capability. The low current resistance of the defective portions of the light-emitting layer can be improved owing to the non-isotropy in a certain crystallization direction of the polycrystalline selenium layer interposed between the electrode and light-emitting layer, i.e. the high resistance of the selenium layer in the direction parallel to the light-emitting layer. Accordingly, the burning of the light-emitting layer, which is caused by the current concentration in the defective portions thereof, can be prevented.

What is claimed is:

1. In an electroluminescent device comprising a light emitting layer of a semiconductor to which has been added an active material that provides light-emitting nuclei, and a pair of electrodes, one overlying each of a pair of opposite surfaces of said layer, means for preventing burn-out of said layer due to current concentrations at defects therein such as pinholes and crystal grain boundaries, said means comprising:
   a selenium layer between one of said surfaces and the electrode overlying the same, the material of said selenium layer
   (1) comprising at least 70% selenium and
   (2) being initially in polycrystalline form so that upon the occurrence of a current concentration at a defect in the light-emitting layer the self-curing property of the material of the selenium layer causes the portion of the selenium layer adjacent to that defect to become substantially nonconductive.

2. The electroluminescent device of claim 1 wherein
   (1) in said light-emitting layer
      (a) the semiconductor is a material of the class that consists of ZnSe and ZnS, and
      (b) the active material is of the class that consists of Mn, Tb and Sm; and
   (2) the material of said selenium layer comprises, in addition to said at least 70% selenium, material from the class that consists of Cd, Bi, the alkali metals and the halogens.

* * * * *